(12) United States Patent
Edwards et al.

(10) Patent No.: US 9,778,319 B2
(45) Date of Patent: Oct. 3, 2017

(54) SYSTEMS AND METHODS FOR SWITCH HEALTH DETERMINATION

(71) Applicant: Freescale Semiconductor, Inc., Austin, TX (US)

(72) Inventors: William E. Edwards, Ann Arbor, MI (US); Anthony F. Andresen, Chandler, AZ (US); Randall C. Gray, Tempe, AZ (US)

(73) Assignee: NXP USA, INC., Austin, TX (US)

( * ) Notice: Subject to any disclaimer, the term of this patent is extended or adjusted under 35 U.S.C. 154(b) by 316 days.

(21) Appl. No.: 14/536,017

(22) Filed: Nov. 7, 2014

(65) Prior Publication Data
US 2016/0131713 A1   May 12, 2016

(51) Int. Cl.
| | |
|---|---|
| G01R 31/02 | (2006.01) |
| G01R 31/327 | (2006.01) |
| G01R 19/00 | (2006.01) |
| H03K 17/18 | (2006.01) |
| H02B 1/24 | (2006.01) |
| G01R 19/165 | (2006.01) |

(52) U.S. Cl.
CPC ... *G01R 31/3274* (2013.01); *G01R 19/16566* (2013.01); *G01R 31/3275* (2013.01); *G01R 31/3277* (2013.01)

(58) Field of Classification Search
CPC ...... G01R 31/327; G01R 31/02; G01R 19/00; H03K 17/18; H03K 5/00; H02B 1/24
USPC .............. 324/415, 418, 422; 307/128, 130; 327/74, 77, 87
See application file for complete search history.

(56) References Cited

U.S. PATENT DOCUMENTS

2013/0207693 A1* 8/2013 Kao .................. H03K 19/00369
                                                          327/87
2014/0333311 A1* 11/2014 Liu ...................... G01R 31/327
                                                          324/418

OTHER PUBLICATIONS

Anonymous, "A Diagnostic to Validate Wetting Current and Measure Switch Contact Resistance Degradation," IP.com, Apr. 25, 2014 (5 pages).

* cited by examiner

*Primary Examiner* — Arleen M Vazquez
*Assistant Examiner* — Neel Shah

(57) ABSTRACT

The embodiments described herein provide systems and methods for determining the health status of a sensed switch. In general, the embodiments described herein determine a measure of a health status of the sensed switch by comparing a voltage on the sensed switch, ascertaining a first comparator state under one test condition and ascertaining a second comparator state under a second test condition. The first comparator state and the second comparator state are and then compared to determine the measure of the health status of the sensed switch.

20 Claims, 6 Drawing Sheets

SYSTEMS AND METHODS FOR SWITCH HEALTH DETERMINATION

TECHNICAL FIELD

Embodiments of the subject matter described herein relate generally to switches and systems and methods for determining switch health.

BACKGROUND

Switches are used in a wide variety of applications. In the past, powered switches were used in most applications. In general, powered switches are directly connected between a load and a power source or between the load and ground. For example, a powered switch can be connected between a power source and a motor, such that a relatively large load current flows through the switch and motor and when the switch is closed. Thus, in powered switches the load current flows through the switch when the switch is closed.

Recently, sensed switches have gained wider use in the marketplace. In contrast with powered switches, a large load current does not flow through the sensed switch. Instead, sensed switches are switches where the state of the switch is read by a detection circuit. The determined state of the switch is then used by the system in some way that fulfills the purpose of the switch.

An ideal sensed switch has infinite resistance when open and zero resistance when closed. Unfortunately, sensed switches degrade with time due to temperature cycling, humidity and contamination. Such degradation can cause unwanted open-state current leakage and unwanted closed-state switch resistance. Open-state current leakage can cause an open switch to be falsely read as closed. Likewise, closed-state resistance can cause a closed switch to be falsely read as open. In either case the degradation can cause errors in reading the switch state and negatively impact the performance of the system. For these and other reasons, it is desirable to provide techniques to determine the health status of sensed switches before degradation in the sensed switch can cause such errors.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The embodiments described herein provide systems and methods for determining the health status of sensed switches. For example, the systems and methods can be used to determine if significant degradation in the contact of a sensed switch has occurred. Such information can be used to determine if the sensed switch has a significant likelihood to fail in the near future, and thus can provide an opportunity to repair or replace the sensed switch before such failure occurs.

In general, the embodiments described herein determine a measure of a health status of the sensed switch by comparing a voltage on the sensed switch, ascertaining a first comparator state under one test condition and ascertaining a second comparator state under a second test condition. The first comparator state and the second comparator state are then compared to determine the measure of the health status of the sensed switch. In one embodiment a comparator is used with at a first threshold voltage and a second threshold voltage, different than the first threshold voltage, to provide the first and second test conditions. In another embodiment a variable current source is used with a first current and a second current to provide the first and second test conditions.

Figure 1:
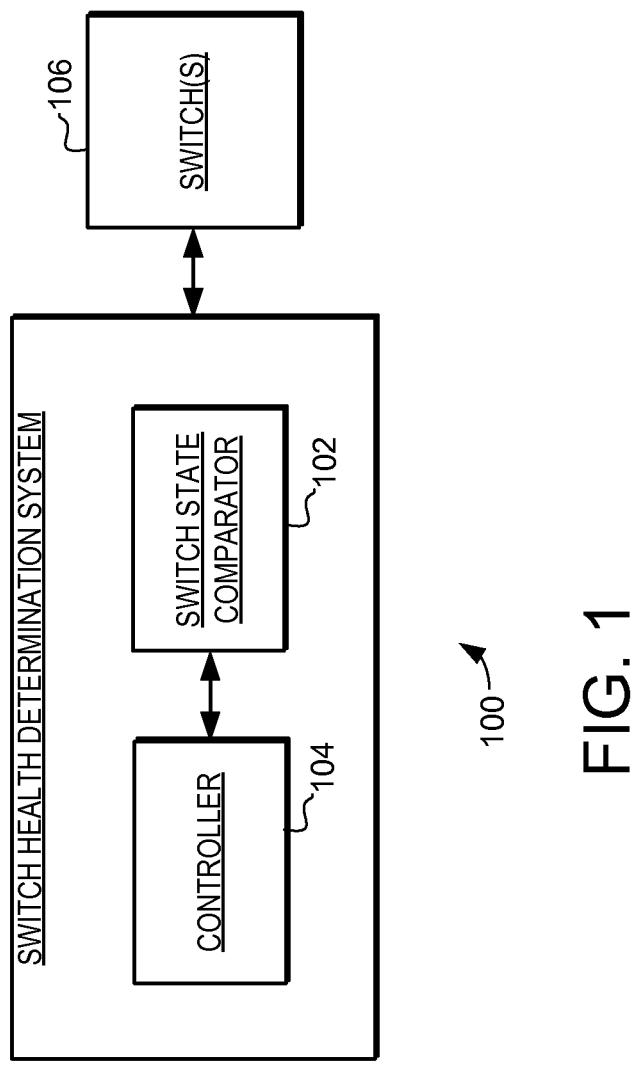
FIG. 1 is a schematic diagram of a switch health determination system in accordance with an example embodiment.

Turning now to FIG. 1, a schematic diagram of a switch health determination system 100 is illustrated. The switch health determination system 100 includes a comparator 102, a controller 104, which are coupled to a switch 106. The switch health determination system 100 determines a health status of the switch 106 by using the comparator 102 and controller 104 to compare a voltage on the switch 106 and to ascertain at least a first comparator state under a first test condition and ascertain a second comparator state under a second test condition. The controller 104 further compares the determined first comparator state and the second comparator state to determine a measure of the health status of the sensed switch.

In one embodiment, the switch health determination system 100 uses at least a first threshold voltage and a second threshold voltage to provide the first and second test conditions. In such an embodiment the comparator 102 is configured to selectively compare a voltage on the switch 106 to a first threshold voltage and a second threshold voltage. The controller 104 is coupled to the comparator 102, and is configured to ascertain a first comparator state using the first threshold voltage and to ascertain a second comparator state using the second threshold voltage. The controller 104 is further configured to compare the first comparator state to the second comparator state and to determine a measure of health status of the switch 106 based at least in part on the comparing of the first comparator state to the second comparator state.

In one embodiment the first threshold voltage and second threshold voltage are provided by a variable threshold voltage source. In this embodiment the variable threshold voltage source would be coupled to the comparator 102 and the controller 104, and would be configured to selectively apply the first threshold voltage and the second threshold voltage to comparator 102 as directed by the controller 104. Furthermore, in such an embodiment the value of the second threshold voltage can be determined at least in part based on the ascertained first state. As will be explained in greater detail below, the second threshold voltage can be set to be higher than the first threshold voltage if the ascertained first comparator state is asserted, while the second threshold voltage can be set to be lower than the first threshold voltage if the ascertained first comparator state is not asserted.

In a second embodiment, the switch health determination system 100 uses a variable current source to provide the first and second test conditions. In such an embodiment, the variable current source is coupled to the switch 106 and is configured to selectively supply a first current and supply a second current to the switch 106. The comparator 102 is configured to compare a voltage on the switch to a threshold voltage. The controller 104 is coupled to the comparator 102 and is configured to ascertain a first comparator state using the first current and to ascertain a second comparator state using the second current. The controller 104 is further configured to compare the first comparator state to the second comparator state and to determine a measure of health status of the switch based at least in part on the comparing of the first comparator state to the second comparator state.

In one embodiment, the variable current source would be coupled to the switch 106 and the controller 104, and would be configured to selectively apply the first current and the second current as directed by the controller 104. Furthermore, in such an embodiment the value of the second current can be determined at least in part based on the ascertained first state. As will be explained in greater detail below, the second current can be set to be higher than the first current if the ascertained first comparator state is asserted, while the second current can be set to be lower than the first current if the ascertained first comparator state is not asserted.

Figure 2:
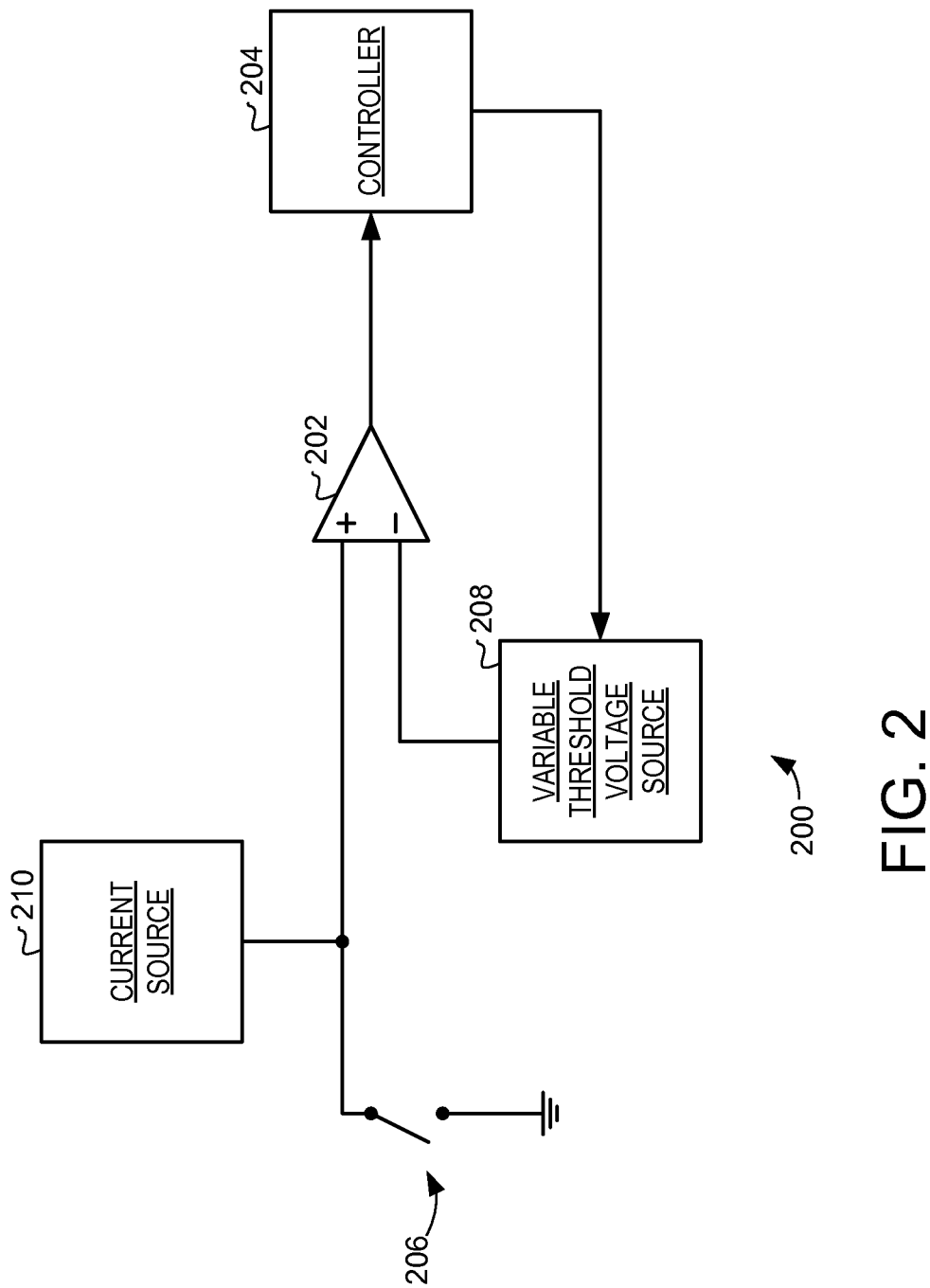
FIG. 2 is a schematic diagram of a switch health determination system in accordance with another example embodiment.

Turning now to FIG. 2, an embodiment of a switch health determination system 200 is illustrated. The switch health determination system 200 includes a comparator 202, a controller 204, a variable threshold voltage source 208, and a current source 210. The switch health determination system 200 is coupled to a sensed switch 206 and is configured to determine a measure of the health status of the switch 206. As will be described in greater detail below, in some embodiments the switch health determination system 200 can be implemented as part of the system used to read the state of the switch 206 during normal operation.

In this illustrated embodiment, the switch health determination system 200 uses at least a first threshold voltage and a second threshold voltage supplied by the variable threshold voltage source 208 to provide the first and second test conditions. Specifically, the comparator 202 is configured to selectively compare a voltage on the switch 206 to a first threshold voltage and a second threshold voltage supplied by the variable threshold voltage source 208, and to provide an output signal that is either asserted or deasserted based on that comparison. The controller 204 is coupled to the output of the comparator 202, and the controller 204 is configured to ascertain a first comparator state obtained when the comparator 202 is using the first threshold voltage and to ascertain a second comparator state obtained when the comparator 202 is using the second threshold voltage. The controller 204 is further configured to compare the first comparator state to the second comparator state and to determine a measure of health status of the switch 206.

The current source 210 is configured to provide a current through the switch 206 for determining the health of the switch 206. In some embodiments, the current source 210 will also be used during normal operation to read the state of the switch 206. As will be described in greater detail below, as such the current source 210 can be configured to provide a wetting current and sustaining current to the switch 206. The current source 210 can be implemented with a variety of devices and circuits. For example, the current source 210 can be implemented with amplifiers, current mirrors, and various combinations of voltage sources and impedances.

The comparator 202 is configured to compare a voltage at a first input node, where the first input node is coupled to the switch 206, to a voltage at a second input node, where second input node is coupled to the variable threshold voltage source 208. The comparator 202 can be implemented with any suitable combination circuits or devices.

The variable threshold voltage source 208 is configured to selectively provide at least a first threshold voltage and a second threshold voltage to the comparator 202. In a typical embodiment, the variable threshold voltage source 208 can be implemented with appropriate combinations of impedance dividers, band gap reference devices, or voltage regulators. In one embodiment the variable threshold voltage source 208 is configured to selectively provide multiple different values of threshold voltages. In such an embodiment the value for the second threshold voltage can be set by the controller 204 based at least in part on the ascertained comparator state.

Specifically, in such an embodiment, the switch health determination system 200 can apply a current from current source 210 and compare the voltage on the switch 206 to a first threshold voltage. The output of the comparator 202 is coupled to the controller 204, and thus the controller 204 can ascertain a first comparator state with the first threshold voltage. Then, the switch health determination system 200 can again apply a current from the current source 210, but this time compare the voltage on the switch 206 to a second threshold voltage. In this case, the value for the second threshold voltage can be determined based on the previously ascertained state. Specifically, the value of the second threshold voltage can be made higher or lower than the first threshold voltage depending upon the ascertained state. For example, the value for the second threshold voltage can be made higher than the first threshold voltage if the ascertained first comparator state indicates the switch is open and the value for the second threshold voltage can be made lower than the first threshold voltage if the ascertained first comparator state indicates the switch is closed. A specific example of such a technique will be described below with reference to FIG. 3.

The comparator state, or more specifically a signal at the output of the comparator 202 (i.e., the signal provided to the controller 204), may be "asserted" or "deasserted." For example, the comparator 202 may assert the comparator output signal when the voltage at the comparator input coupled to the switch 206 is greater than a threshold voltage provided at the input to the comparator 202 that is coupled to the variable threshold voltage source 210. Conversely, the comparator 202 may deassert the comparator output signal when the voltage at the comparator input coupled to the switch 206 is less than the threshold voltage at the input to the comparator 202 that is coupled to the variable threshold voltage source 210. In an alternate embodiment, the opposite may be true.

As was described above, in some embodiments the switch health determination system 200 can be implemented as part of the system used to read the state of the switch 206 during normal operation. In such an embodiment, the comparator 202, the controller 204, the variable threshold voltage source 208 and the current source 210 would be used for both determining the health status of the switch 206 and reading the state of the switch 206 during normal operation. When being used for normal switch reading the variable threshold voltage source 208 would be controlled to provide an appropriate threshold voltage, and the current source 210 would provide an appropriate current.

It should also be noted that in some embodiments the various elements can be used for heath determination of multiple switches. For example, in a typical embodiment the comparator 202, controller 204 and variable threshold voltage source 208 can be selectively coupled to an array of switches 206 and used to selectively determine the health status of each switch 206 in the array.

For such an array of switches the system can be implemented in a variety of ways. For example, the system can be implemented in a distributed fashion, with a separate comparator 202, variable threshold voltage source 208, and current source 210 for each switch 206 in the array. In other embodiments various elements can be shared between multiple switches 206. For example, multiple switches 206 can be coupled to share comparators 202, variable threshold voltage sources 208 and current sources 210. In such an embodiment the various elements can be multiplexed together into different channels for different switches 206. And in some cases a combination of distributed and shared components can be used.

In some embodiments, the current source 210 can be configured to provide a wetting current and sustaining current to the switch 206. In general, a wetting current is a relatively large current applied for a short period of time that is designed to be sufficient to burn off oxidation from the switch contacts. In a typical embodiment this relatively large wetting current would be applied each time the switch 206 is closed. The sustaining current is a relatively reduced amount of current, and is typically applied after the wetting current.

Figure 3:
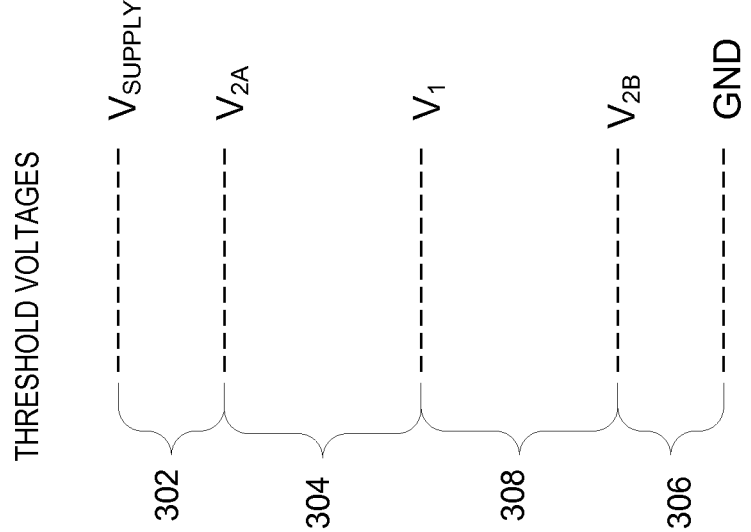
FIG. 3 is a graphical representation of exemplary threshold voltages in accordance with an example embodiment.

Turning now to FIG. 3, a representation of threshold voltages is illustrated in graph 300. Specifically, graph 300 shows a first threshold voltage $V_1$ and two second threshold voltages $V_{2A}$ and $V_{2B}$. These threshold voltages are examples of the type of threshold voltages that can be provided by a variable threshold voltage source (e.g., variable voltage source 208). Graph 300 also shows a $V_{SUPPLY}$ voltage and ground GND. The second threshold voltage $V_{2A}$ defines a boundary between a first voltage range 302 and a second voltage range 304. Likewise, the second threshold voltage $V_{2B}$ defines a boundary between a third voltage range 306 and a fourth voltage range 308.

In this example, the value for the first threshold voltage $V_1$ is approximately halfway between $V_{SUPPLY}$ voltage and ground GND. As such, the first threshold voltage $V_1$ is an example of a voltage level that can be used (e.g., provided by variable threshold voltage source 208 to comparator 202) during a normal sensing operation to read the state of the switch, i.e., to determine if the switch is open or closed. The values for the two second threshold voltages $V_{2A}$ and $V_{2B}$ are likewise examples of voltage levels that can be used with the first threshold voltage $V_1$ for determining the health status of the switch.

Referring to FIGS. 2 and 3 together, in a healthy condition the open-state voltage on the switch 206 would typically be relatively near $V_{SUPPLY}$ (e.g., in the first voltage range 302 between threshold voltage $V_{2A}$ and $V_{SUPPLY}$). In a moderately degraded condition the open-state voltage on switch 206 can drop significantly (e.g., to the second voltage range 304 below threshold voltage $V_{2A}$) due to excessive open-circuit current leakage. In a fully degraded condition the open-state voltage on the switch 206 can drop below the threshold voltage $V_1$, thus preventing the switch 206 from being accurately read in the open state.

Likewise, in a healthy condition the closed-state voltage on the switch 206 would typically be relatively near GND (e.g., in the third voltage range 306 between threshold voltage $V_{2B}$ and GND). In a moderately degraded condition the closed-state voltage on switch 206 can rise significantly (e.g., to the fourth voltage range 308 above threshold voltage $V_{2B}$) due to excessive closed-state resistance. In a fully degraded condition the closed-state voltage on the switch 206 can rise above the threshold voltage $V_1$, thus preventing the switch 206 from being accurately read in the closed state.

Again, the first threshold voltage $V_1$ can be used during a normal sensing operation to read the state of the switch 206. In accordance with the embodiments described herein, this reading of the state of the switch 206 with the first threshold voltage $V_1$ can also be used to determine the health of the switch 206. In such an embodiment, the reading of the state of the switch 206 with the first threshold voltage $V_1$ can also provide the first comparator state. And, in such an embodiment, one of the two second threshold voltages $V_{2A}$ and $V_{2B}$ can then be used (e.g., provided by variable threshold voltage source 208 to comparator 202) to ascertain a second comparator state and to determine a measure of the health of the switch 206.

Specifically, if during the initial read of the state of the switch 206 the controller 204 determines (based on the first comparator state) that the voltage on the switch 206 is greater than the first threshold voltage $V_1$ (i.e., the switch 206 is in an open state) the controller 204 can provide a control signal to variable threshold voltage source 208 to provide the second threshold voltage $V_{2A}$ during the determination of the second comparator state. Conversely, if the controller 204 determines (based on the first comparator state) that the voltage on the switch 206 is less than the first threshold voltage $V_1$ (i.e., the switch 206 is in a closed state) the controller 204 can provide a control signal to variable threshold voltage source 208 to provide the second threshold voltage $V_{2B}$ during the determination of the second comparator state.

Thus, determining the second comparator state using the second threshold voltage $V_{2A}$ can be used to determine the health of the switch 206 when the switch has been previously determined to be open using the first threshold voltage $V_1$. Conversely, determining the second comparator state using the second threshold voltage $V_{2B}$ can be used to determine the health of the switch 206 when the switch has been previously determined to be closed using the first threshold voltage $V_1$.

The value for the second threshold voltage $V_{2A}$ would thus typically be selected to identify switches that are degrading significantly and are at risking of failing. Stated another way, the selection of a value for the second threshold voltage $V_{2A}$ defines the maximum amount of leakage current that can occur in an open switch 206 and still be considered to be healthy and not significantly degraded to the point where the probability of failure is unacceptably high.

The value for the second threshold voltage $V_{2B}$ would likewise typically be selected to identify switches that are degrading significantly. Stated another way, the selection of a value for the second threshold voltage $V_{2A}$ defines the maximum amount of closed-state resistance that can occur in a closed switch 206 and still considered to be healthy and not significantly degraded to the point where the probability of failure is unacceptably high.

In each case the values selected for the second threshold voltages $V_{2A}$ and $V_{2B}$ would typically depend on a variety of factors, including the parameters of the switch, the criticality of the switch, and the acceptable likelihood of failure of the switch. It should be noted that in some embodiments the values selected for the second threshold voltages $V_{2A}$ and $V_{2B}$ could be different for different switches in a system. For example, switches associated with critical systems can be tested with relatively conservative second threshold voltages. Finally, it should be noted that while FIG. 3 illustrates only two values for second threshold voltages, in some cases additional values could be used.

Figure 4:
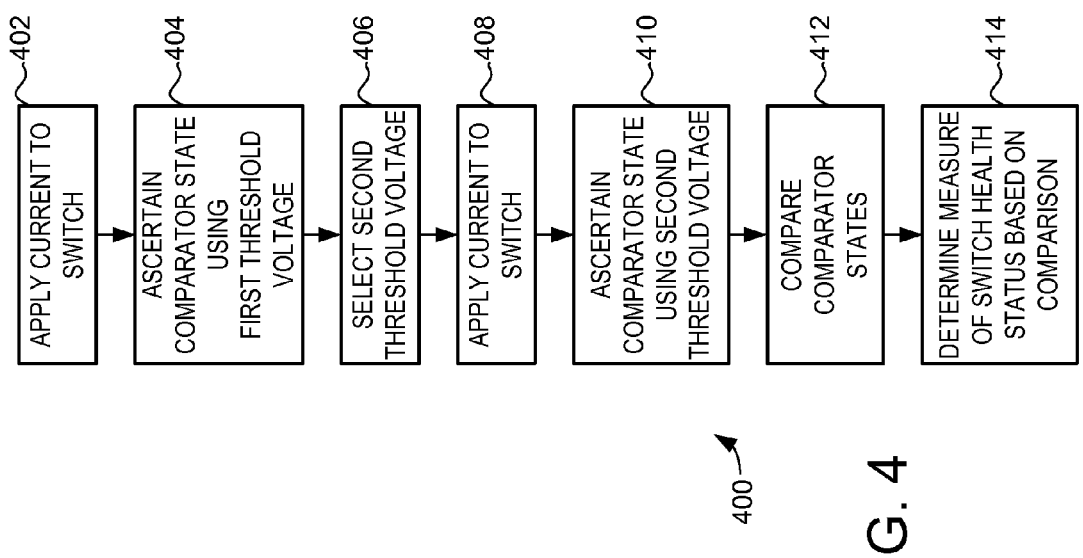
FIG. 4 is a flow diagram illustrating a method of switch health determination in accordance with another example embodiment.

Turning now to FIG. 4, a method 400 for determining the health status of a switch is illustrated. In general, the method 400 utilizes at least a first threshold voltage and a second threshold voltage to determine a measure of the health status of a switch (e.g., switch 206). In step 402 a test current is applied to the switch. Again, such a test current can be applied by current source (e.g., current source 210) that is also used to read the state of the switch. In step 404 the first comparator state is ascertained (e.g., by controller 204) with the test current applied and using the first threshold voltage (e.g., the voltage provided by variable threshold voltage source 208). Again, the comparator state can be determined with a comparator (e.g., comparator 202) having inputs coupled to the switch and a variable threshold voltage source (e.g., variable threshold voltage source 208).

In step 406 a value for the second threshold voltage is selected based on the ascertained first comparator state. Again, in such a step the first comparator state corresponds to a state of the switch (i.e., open or closed). If during the determination of the first comparator state the switch is determined to be open the value for the second threshold voltage can be selected to be greater than the first threshold voltage. If instead the switch is determined to be closed, the value for the second threshold voltage can be selected to be less than the first threshold voltage.

In step 408 a test current is again applied the switch. In step 410 the second comparator state is ascertained with the test current applied and using the first threshold voltage. It should be noted that it is generally preferable to perform steps 408 and 410 relatively quickly after steps 402 and 404 to reduce the probability of the switch itself changing states between ascertaining the comparator states.

In step 412 the first and second comparator states are compared. In step 414 a measure of the health state of the switch is determined based at least in part of the comparison of the comparator states. In general, if the first comparator state and the second comparator state are the same this is an indication that the switch is not excessively degraded. In contrast, if the first and second comparator states are different this can be an indication of degradation in the switch. However, in some cases additional data may be also used in the determination of the health status of the switch.

For example, in some embodiments, steps 402-412 can be repeated multiple times to determine the health status of the switch. In such embodiments it may be desirable for the system to see different comparator states multiple times to confirm that the changes in comparator state are the result of degradation, and not instead the result of intervening changes in switch state.

In other examples, steps 402-412 may be repeated multiple times with different values for the second threshold voltage. In such an example the use of multiple different values for the second threshold voltage can serve to further quantify the amount of degradation in the switch. For example, the second threshold voltage can be raised or lowered until a change in comparator state occurs. In such a technique the voltage level at which a change in comparator state begins to occur can be used to further quantify the health status of the switch.

The measure of the health status of the switch determined in step 414 can be expressed in a variety of ways. For example, in some cases a measure of the health status can be expressed by setting a flag or other binary quantity that indicates the health status of the switch has significantly degraded. Such a flag can then be used to indicate that the switch should be replaced soon, ideally before the switch actually fails. For example, the flag can indicate that the switch should be replaced at the next scheduled maintenance. Alternatively, the flag can indicate that switch should be immediately replaced. Such an indication can be provided to the user of the device (i.e., the driver of a car) through an indicator on the dashboard (or other user interface) or to an overall monitoring and maintenance system.

In other embodiments multiple levels of health status measurement could be provided, each indicating a different level of switch degradation. In such a system, relatively low levels of degradation can indicate that the switch should be replaced in the future, while high levels of degradation can indicate that the switch should be replaced as soon as possible. In making such an indication the system can utilize other data, such as the criticality of the switch to the safe operation of the device.

In other embodiments the measure of the health status of the switch can be used to adjust the operation of the switch reading system. For example, if the measure indicates that the switch has degraded, the current or threshold voltage of the system can be used to compensate for the degraded switch. For example, the current used to read the state of the switch can be increased to compensate for excessive open-state leakage current. As another example, the current used to read the state of the switch can be decreased to compensate for excessive closed-state resistance. As another example, the threshold voltage used to read the state of the switch can be decreased to compensate for excessive open-state current leakage. As another example, the threshold voltage used to read the state of the switch can be increased to compensate for excessive closed-state resistance.

In these and other examples the method 400 can be implemented as part of a built-in self-test routine. Such a built-in self-test routine can be implemented to be self-executing without system direction. In other embodiments the method 400 can be performed in response to a command issued by the system. In either case the method 400 can be controlled by embedded logic or by an external controller such as a microprocessor. In each of these examples, the method 400 can be implemented to reduce the software overhead that would otherwise be required to test of the health of the switches.

Figure 5:
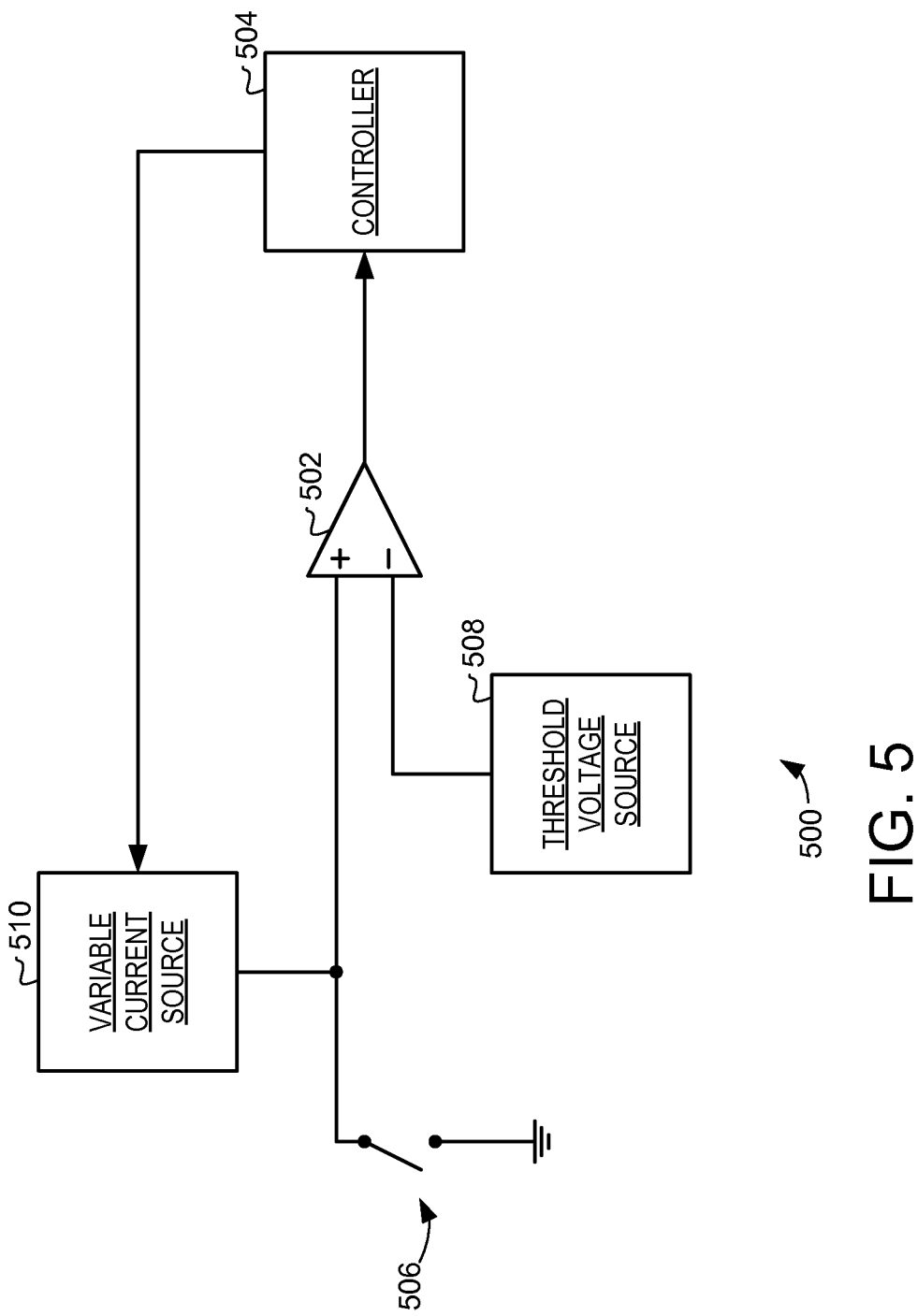
FIG. 5 is a schematic diagram of a switch health determination system in accordance with another example embodiment.

As was described above, in other embodiments a variable current source can be used to provide the two test conditions. Turning now to FIG. 5, an embodiment of a switch health determination system 500 is illustrated. The switch health determination system 500 includes a comparator 502, a controller 504, a threshold voltage source 508, and a variable current source 510. The switch health determination system 500 is coupled to a sensed switch 506 and is configured to determine a measure of the health status of the switch 506. As will be described in greater detail below, in some embodiments the switch health determination system 500 can be implemented as part of the system used to read the state of the switch 506 during normal operation.

In this illustrated embodiment, the switch health determination system 500 uses at least a first test current and a second test current supplied by the variable current source 510 to provide the first and second test conditions. Specifically, the comparator 502 is configured to selectively compare a voltage on the switch 506 to the threshold voltage with at least a first current and a second current supplied by the variable current source 510, and to provide an output signal that is either asserted or deasserted based on that comparison. The controller 504 is coupled to the output of the comparator 502, and the controller 504 is configured to ascertain a first comparator state obtained when the first test current is being applied and to ascertain a second comparator state obtained when the second test current is being applied. The controller 504 is further configured to compare the first comparator state to the second comparator state and to determine a measure of health status of the switch 506.

The variable current source 510 is configured to provide the test currents through the switch 506 for determining the health of the switch 506. In some embodiments, the variable current source 510 will also be used during normal operation to read the state of the switch 506. As will be described in greater detail below, as such the variable current source 510 can be configured to provide a wetting current and sustaining current to the switch 506. The variable current source 510 can be implemented with a variety of devices and circuits. For example, the variable current source 510 can be implemented with amplifiers, current mirrors, and various combinations of voltage sources and impedances.

As was described above, in some embodiments the switch health determination system 500 can be implemented as part of the system used to read the state of the switch 506 during normal operation. In such an embodiment, the comparator 502, the controller 504, the threshold voltage source 508 and the variable current source 510 would be used for both determining the health status of the switch 506 and reading the state of the switch 506 during normal operation. When being used for normal switch reading the variable current source 510 would provide an appropriate current for reading the state of the switch 506. In some embodiments, the current source 510 can be configured to provide a wetting current and sustaining current to the switch 506.

During operation to test of the health of the switch 506, the first test current would normally be set to provide an open-state voltage on the switch 506 near a supply voltage. In a degraded switch, the open-circuit leakage current can make the open-state voltage on the switch 506 drop. If the leakage current is large enough the open-state voltage can drop below the threshold voltage, thus preventing the switch 506 from being accurately read in the open state.

Likewise, in a healthy condition the closed-state voltage on the switch 506 would typically be relatively near ground with the first test current applied. In a degraded condition the closed-state voltage on switch 506 can rise significantly due to excessive closed-state resistance. If the closed-state resistance is large enough the closed-state voltage can rise above the threshold voltage, thus preventing the switch 506 from being accurately read in the closed state.

In one embodiment the variable current source 510 is configured to selectively provide at least a first and second test current, with the magnitude of the second test current set by the controller 504 based at least in part on the ascertained first comparator state.

Specifically, in such an embodiment, the switch health determination system 500 can apply a first test current from current source 510 and the comparator 502 can compare the voltage on the switch 506 to a threshold voltage provided by threshold voltage source 508. The output of the comparator 502 is coupled to the controller 504, and thus the controller 504 can ascertain a first comparator state using the first test current. Then, the switch health determination system 500 can apply a second current test current from the current source 510. In this case, the magnitude of the second test current can be determined based on the previously ascertained state. Specifically, the magnitude of the second test current can be increased or decreased relative to the first test current depending upon the ascertained first comparator state. For example, the magnitude for the second test current can be made lower than the first test current if the ascertained first comparator state indicates the switch is open and the magnitude for the second test current can be made higher than the first test current if the ascertained first comparator state indicates the switch is closed.

Specifically, if during the initial read of the state of the switch 506 the controller 504 determines that the voltage on the switch 506 is greater than the threshold voltage (i.e., the switch 506 is in an open state), the controller 504 can provide a control signal to variable current source 510 to cause the variable current source 510 to provide a reduced second test current during the determination of the second comparator state. Specifically, a reduced second test current effectively drops the voltage at the switch 506, and if the open-state current leakage is large enough the voltage on the switch 506 can drop below the threshold voltage. Thus, a different second comparator state with the reduced second test current can indicate excessive open-state current leakage.

Conversely, if the controller 504 determines that the voltage on the switch 506 is less than the threshold voltage (i.e., the switch 506 is in a closed state) the controller 504 can provide a control signal to variable current source 510 to cause the variable current source 510 to provide an increased second test current during the determination of the second comparator state. Specifically, an increased second test current effectively raises the voltage at the switch 506, and if closed-state resistance is large enough that voltage can rise above the threshold voltage. Thus, a different second comparator state with the increased second test current can indicate excessive closed-state resistance.

In each case the magnitude selected for the second test current would typically depend on a variety of factors, including the parameters of the switch, the criticality of the switch, and the acceptable likelihood of failure of the switch.

The comparator state, or more specifically a signal at the output of the comparator 502 (i.e., the signal provided to the controller 504), may be asserted or deasserted. For example, the comparator 502 may assert the comparator output signal when the voltage at the comparator input coupled to the switch 506 is greater than a threshold voltage provided at the input to the comparator 502 that is coupled to the threshold voltage source 510. Conversely, the comparator 502 may deassert the comparator output signal when the voltage at the comparator input coupled to the switch 506 is less than the threshold voltage at the input to the comparator 502 that is coupled to the threshold voltage source 508. In an alternate embodiment, the opposite may be true.

Again, it should be noted that in some embodiments the first test current can also be used during a normal sensing operation to read the state of the switch 506. This reading of the state of the switch 506 with the first test current can also provide the first comparator state. And, in such an embodiment, one of two second test currents can then be used to ascertain a second comparator state and to determine a measure of the health of the switch 506.

Figure 6:
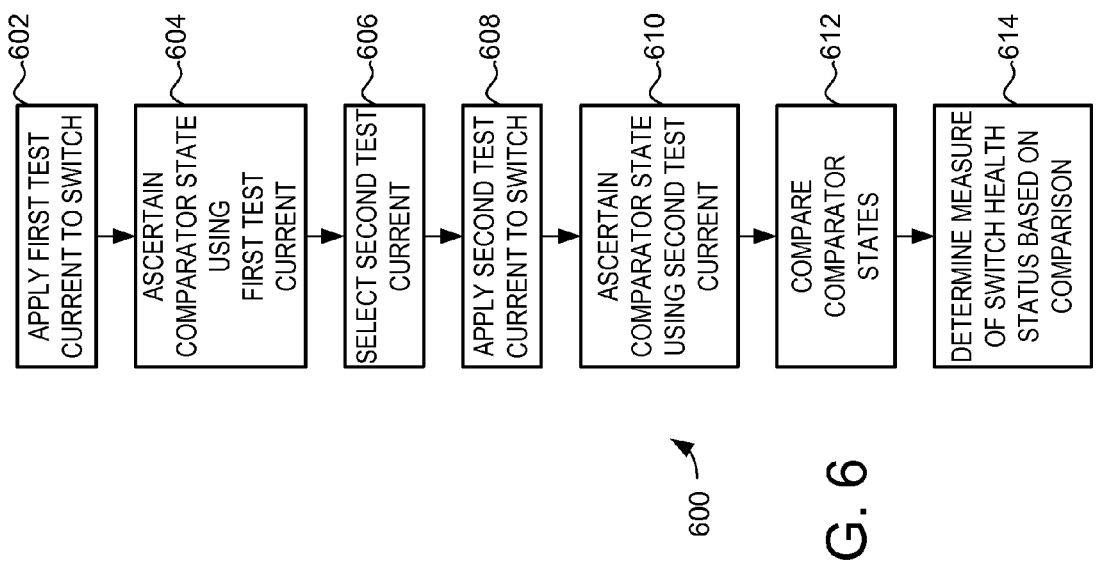
FIG. 6 is a flow diagram illustrating a method of switch health determination in accordance with another example embodiment.

Turning now to FIG. 6, a method 600 for determining the health status of a switch is illustrated. In general, the method 600 utilizes at least a first test current and a second test current to determine a measure of the health status of a switch (e.g., switch 506). In step 602 a first test current is applied to the switch. Again, such a first test current can be applied by variable current source (e.g., variable current source 510) that is also used to read the state of the switch. In step 604 the first comparator state is ascertained with the first test current applied. Again, the first comparator state can be determined (e.g., by controller 504) based on an output signal from a comparator (e.g., comparator 502) having inputs coupled to the switch and threshold voltage source (e.g., threshold voltage source 508).

In step 606 a magnitude for the second test current is selected based on the ascertained first comparator state. Again, in such a step the first comparator state corresponds to a state of the switch (i.e., open or closed). If during the determination of the first comparator state the switch is determined to be open the magnitude of the second test current can be decreased relative to the first test current. If instead the switch is determined to be closed, the magnitude of the second test current can be selected to be increased compared to the first test current.

In step 608 the second test current is applied the switch. In step 610 the second comparator state is ascertained with the second test current applied. It should be noted that it is generally preferable to perform steps 608 and 610 relatively quickly after steps 602 and 604 to reduce the probability of the switch itself changing states between ascertaining the comparator states.

In step 612 the first and second comparator states are compared. In step 614 a measure of the health state of the switch is determined based at least in part of the comparison of the comparator states. In general, if the first comparator state and the second comparator state are the same this is an indication that the switch is not excessively degraded. In contrast, if the first and second comparator states are different this can be an indication of degradation in the switch. However, in some cases additional data may be also used in the determination of the health status of the switch.

For example, in some embodiments, steps 602-612 can be repeated multiple times to determine the health status of the switch. In such embodiments it may be desirable to for the system to see different comparator states multiple times to confirm that the changes in comparator state are the result of degradation, and not instead the result of intervening changes in switch state.

In other examples, steps 602-612 may be repeated multiple times with different values for the second test current. In such an example the use of multiple different values for the second test current can serve to further quantify the amount of degradation in the switch. For example, the second test current can be raised or lowered until a change in comparator state occurs. In such a technique the current level at which a change in comparator state begins to occur can be used to further quantify the health status of the switch.

In one embodiment, a switch health determination system is provided. The switch health determination system comprises: a comparator coupled to a switch, the comparator configured to selectively compare a voltage on the switch to a first threshold voltage and a second threshold voltage, wherein the first and second threshold voltages have different values; and a controller coupled to the comparator, the controller configured to ascertain a first comparator state when the first threshold voltage is provided to the comparator and to ascertain a second comparator state when the second threshold voltage is provided to the comparator, the controller further configured to compare the first comparator state to the second comparator state and to determine a measure of health status of the switch based at least in part on the comparing of the first comparator state to the second comparator state.

In another embodiment, the switch health determination system comprises: a variable current source, the current source coupled to a switch and configured to selectively supply a first current and supply a second current to the switch, wherein the first current and the second current have different values; a comparator coupled to the switch, the comparator configured to compare a voltage on the switch to a threshold voltage; and a controller coupled to the comparator and to the variable current source, the controller configured to ascertain a first comparator state when the first current is supplied by the variable current source and to ascertain a second comparator state when the second current is supplied by the variable current source, the controller further configured to compare the first comparator state to the second comparator state and to determine a measure of health status of the switch based at least in part on the comparing of the first comparator state to the second comparator state.

In another embodiment, a method performed by a switch health determination system for determining a health status of a switch is provided, the method comprising: comparing a voltage on a switch to a first threshold voltage to ascertain a first comparator state when the switch health determination system is under a first test condition; comparing the voltage on the switch to a second threshold voltage to ascertain a second comparator state when the switch health determination system is under a second test condition that is different from the first test condition; and comparing the first comparator state to the second comparator state to determine a measure of health status of the switch.

In one particular embodiment of the method, the method additionally comprises: before comparing the voltage on the switch to the first threshold voltage, configuring the switch health determination system in the first test condition by applying the first threshold voltage to a comparator that is used to perform the comparing; and before comparing the voltage on the switch to the first threshold voltage, configuring the switch health determination system in the second tests condition by applying the second threshold voltage to the comparator, wherein the first threshold voltage and the second threshold voltage are different.

In another embodiment of the method, the first and second threshold voltages are equal, and the method further comprises: before comparing the voltage on the switch to the first threshold voltage, configuring the switch health determination system in the first test condition by applying a first current to the switch; and before comparing the voltage on the switch to the first threshold voltage, configuring the switch health determination system in the second test condition by applying a second current to the switch, wherein the first current and the second current are different.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematics shown in the figures depict several exemplary arrangements of elements, additional intervening elements, devices, features, or components may be present in other embodiments of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A switch health determination system, comprising:
   a comparator coupled to a switch, the comparator configured to selectively compare a voltage on the switch to a first threshold voltage and a second threshold voltage, wherein the first and second threshold voltages have different values; and
   a controller coupled to the comparator, the controller configured to ascertain a first comparator state when the first threshold voltage is provided to the comparator and to ascertain a second comparator state when the second threshold voltage is provided to the comparator, the controller further configured to compare the first comparator state to the second comparator state and to determine a measure of health status of the switch based at least in part on the comparing of the first comparator state to the second comparator state.

2. The switch health determination system of claim 1 further comprising:
   a current source, the current source coupled to the switch and configured to supply current to the switch.

3. The switch health determination system of claim 1 further comprising:
   a variable threshold voltage source, wherein the variable threshold voltage source is coupled to the comparator and the controller, and wherein the variable threshold voltage source is configured to selectively apply the first threshold voltage and the second threshold voltage to the comparator as directed by the controller.

4. The switch health determination system of claim 3 wherein the controller is further configured to determine a value for the second threshold voltage based at least in part on the ascertained first comparator state.

5. The switch health determination system of claim 4 wherein the controller is configured to determine the value for the second threshold voltage to be higher than the first threshold voltage if the ascertained first comparator state indicates the switch is open wherein the controller is to determine the value for the second threshold voltage to be lower than the first threshold voltage if the ascertained first comparator state indicates the switch is closed.

6. The switch health determination system of claim 1 wherein the first threshold voltage is further utilized by the controller to read a state of the switch during operation of the switch.

7. The switch health determination system of claim 1 wherein the measure of health status is used to provide an indication that the switch should be replaced.

8. The switch health determination system of claim 1 wherein the controller is further configured to increase a threshold voltage used to read a state of the switch in response to the measure of the health status of the switch indicating excessive closed-state resistance in the switch, and configured to decrease the threshold voltage used to read the state of the switch in response to the measure of the health status of the switch indicating excessive open-state current leakage in the switch.

9. A switch health determination system, comprising:
   a comparator coupled to a switch, the comparator configured to selectively compare a voltage on the switch to a first threshold voltage and a second threshold voltage, wherein the first and second threshold voltages have different values;
   a controller coupled to the comparator, the controller configured to ascertain a first comparator state when the first threshold voltage is provided to the comparator and to ascertain a second comparator state when the second threshold voltage is provided to the comparator, the controller further configured to compare the first comparator state to the second comparator state and to determine a measure of health status of the switch based at least in part on the comparing of the first comparator state to the second comparator state; and
   a variable threshold voltage source, wherein the variable threshold voltage source is coupled to the comparator and the controller, and wherein the variable threshold voltage source is configured to selectively apply the first threshold voltage and the second threshold voltage to the comparator as directed by the controller.

10. The switch health determination system of claim 9 further comprising:

a current source, the current source coupled to the switch and configured to supply current to the switch.

11. The switch health determination system of claim 9 wherein the controller is further configured to determine a value for the second threshold voltage based at least in part on the ascertained first comparator state.

12. The switch health determination system of claim 11 wherein the controller is configured to determine the value for the second threshold voltage to be higher than the first threshold voltage if the ascertained first comparator state indicates the switch is open wherein the controller is to determine the value for the second threshold voltage to be lower than the first threshold voltage if the ascertained first comparator state indicates the switch is closed.

13. The switch health determination system of claim 9 wherein the first threshold voltage is further utilized by the controller to read a state of the switch during operation of the switch.

14. The switch health determination system of claim 9 wherein the controller is further configured to increase a threshold voltage used to read a state of the switch in response to the measure of the health status of the switch indicating excessive closed-state resistance in the switch, and configured to decrease the threshold voltage used to read the state of the switch in response to the measure of the health status of the switch indicating excessive open-state current leakage in the switch.

15. A switch health determination system, comprising:
   a current source, the current source coupled to the switch and configured to supply current to the switch;
   a comparator coupled to a switch, the comparator configured to selectively compare a voltage on the switch resulting from the current supplied to the switch to a first threshold voltage and a second threshold voltage, wherein the first and second threshold voltages have different values; and
   a controller coupled to the comparator, the controller configured to ascertain a first comparator state when the first threshold voltage is provided to the comparator and to ascertain a second comparator state when the second threshold voltage is provided to the comparator, the controller further configured to compare the first comparator state to the second comparator state and to determine a measure of health status of the switch based at least in part on the comparing of the first comparator state to the second comparator state.

16. The switch health determination system of claim 15 further comprising:
   a variable threshold voltage source, wherein the variable threshold voltage source is coupled to the comparator and the controller, and wherein the variable threshold voltage source is configured to selectively apply the first threshold voltage and the second threshold voltage to the comparator as directed by the controller.

17. The switch health determination system of claim 16 wherein the controller is further configured to determine a value for the second threshold voltage based at least in part on the ascertained first comparator state.

18. The switch health determination system of claim 17 wherein the controller is configured to determine the value for the second threshold voltage to be higher than the first threshold voltage if the ascertained first comparator state indicates the switch is open wherein the controller is to determine the value for the second threshold voltage to be lower than the first threshold voltage if the ascertained first comparator state indicates the switch is closed.

19. The switch health determination system of claim 15 wherein the first threshold voltage is further utilized by the controller to read a state of the switch during operation of the switch.

20. The switch health determination system of claim 15 wherein the controller is further configured to increase a threshold voltage used to read a state of the switch in response to the measure of the health status of the switch indicating excessive closed-state resistance in the switch, and configured to decrease the threshold voltage used to read the state of the switch in response to the measure of the health status of the switch indicating excessive open-state current leakage in the switch.

* * * * *